US009759493B1

(12) United States Patent
Bharathan et al.

(10) Patent No.: US 9,759,493 B1
(45) Date of Patent: Sep. 12, 2017

(54) FLUID-COOLED HEAT SINK FOR USE IN COOLING VARIOUS DEVICES

(71) Applicants: Desikan Bharathan, Lakewood, CO (US); Kevin Bennion, Littleton, CO (US); Kenneth Kelly, Evergreen, CO (US); Sreekant Narumanchi, Littleton (CO)

(72) Inventors: Desikan Bharathan, Lakewood, CO (US); Kevin Bennion, Littleton, CO (US); Kenneth Kelly, Evergreen, CO (US); Sreekant Narumanchi, Littleton (CO)

(73) Assignee: U.S. Department of Energy, Washington, DC (US)

( * ) Notice: Subject to any disclaimer, the term of this patent is extended or adjusted under 35 U.S.C. 154(b) by 326 days.

(21) Appl. No.: 14/626,964

(22) Filed: Feb. 20, 2015

Related U.S. Application Data

(62) Division of application No. 13/021,853, filed on Feb. 7, 2011, now Pat. No. 9,010,405.

(51) Int. Cl.
*F28F 7/00* (2006.01)
*F28D 15/00* (2006.01)
*F28F 13/08* (2006.01)
*H01L 23/46* (2006.01)
*F28D 21/00* (2006.01)

(52) U.S. Cl.
CPC ............ *F28D 15/00* (2013.01); *F28F 13/08* (2013.01); *H01L 23/46* (2013.01); *F28D 2021/0028* (2013.01); *F28D 2021/0029* (2013.01)

(58) Field of Classification Search
CPC ............ F28D 15/00; F28D 2021/0028; F28D 2021/0029; H01L 23/40; H01L 23/46; H01L 23/467; F28F 13/08; F28F 13/14; F28F 3/02
See application file for complete search history.

(56) References Cited

U.S. PATENT DOCUMENTS

| 5,517,757 | A | 5/1996 | Hayashi et al. |
| 6,861,293 | B2 | 3/2005 | Soule |
| 7,317,618 | B2 * | 1/2008 | Robinson ............... H01L 23/552 |
| | | | 165/80.3 |

OTHER PUBLICATIONS

Divinsky et al., "Thermofluid Analysis of Staggered and Inline Pin Fin Heat Sinks", Thermal and Thermomechanical Phenomena in Electronic Systems, 2000. ITHERM 2000. The Seventh Intersociety Conference on (2000). www.ieeexplore.org.

* cited by examiner

*Primary Examiner* — Ryan J Walters
*Assistant Examiner* — Jon T Schermerhorn
(74) *Attorney, Agent, or Firm* — Karen L. Blouin; Michael J. Dobbs; Brian J. Lally

(57) ABSTRACT

The disclosure provides a fluid-cooled heat sink having a heat transfer base, a shroud, and a plurality of heat transfer fins in thermal communication with the heat transfer base and the shroud, where the heat transfer base, heat transfer fins, and the shroud form a central fluid channel through which a forced or free cooling fluid may flow. The heat transfer pins are arranged around the central fluid channel with a flow space provided between adjacent pins, allowing for some portion of the central fluid channel flow to divert through the flow space. The arrangement reduces the pressure drop of the flow through the fins, optimizes average (Continued)

heat transfer coefficients, reduces contact and fin-pin resistances, and reduces the physical footprint of the heat sink in an operating environment.

11 Claims, 6 Drawing Sheets

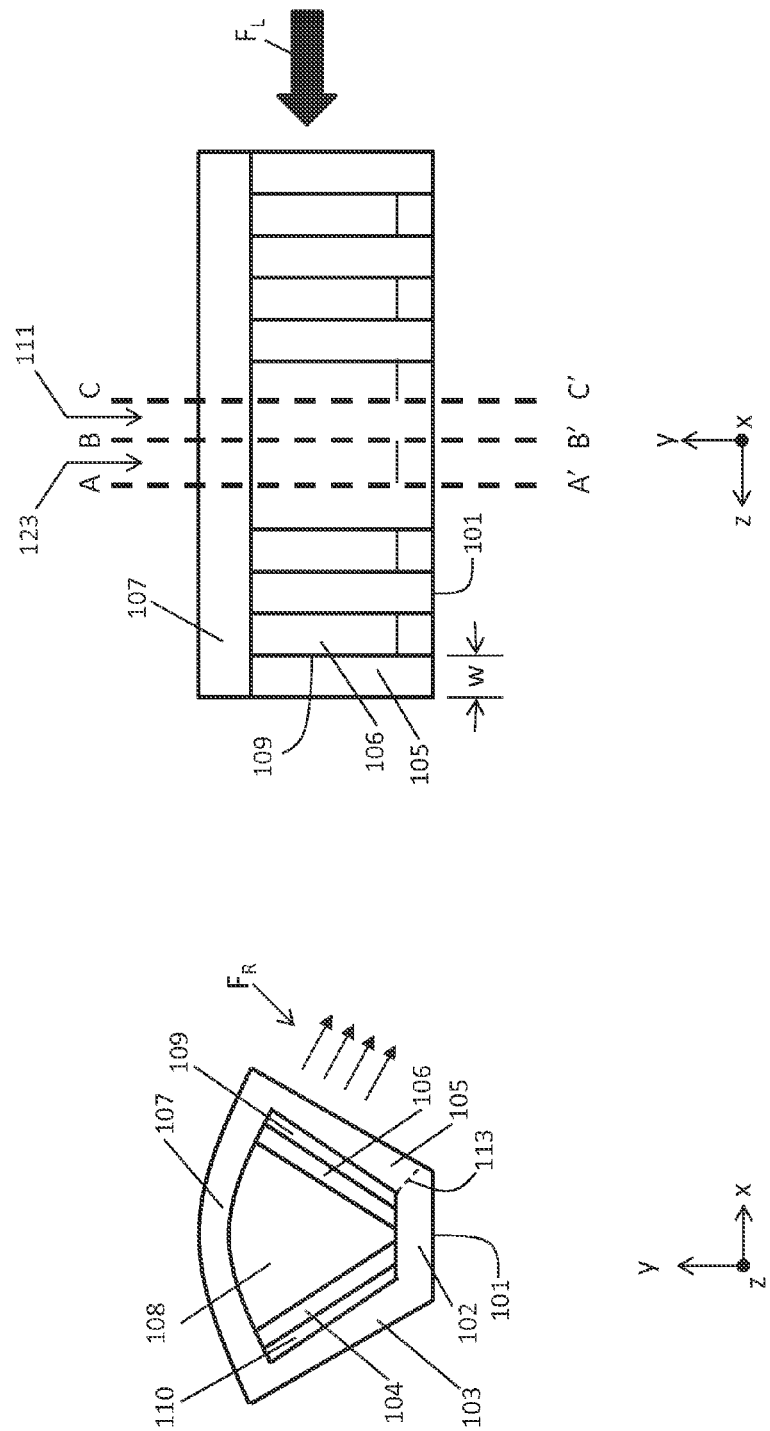

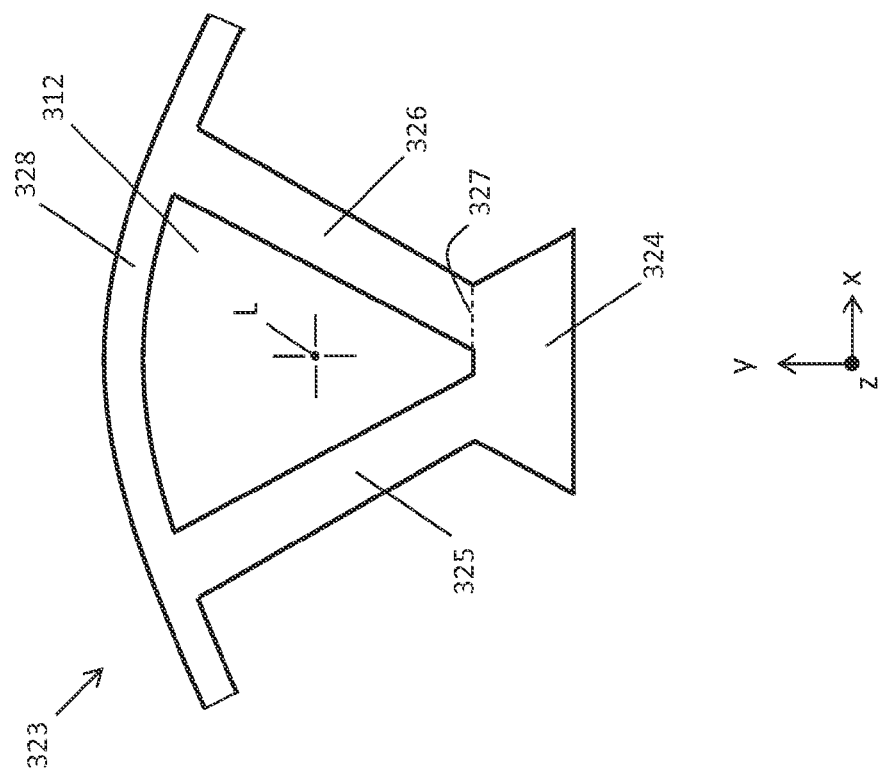

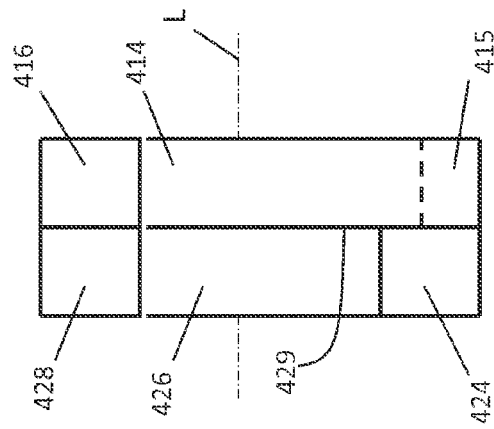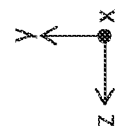
FIG. 4B
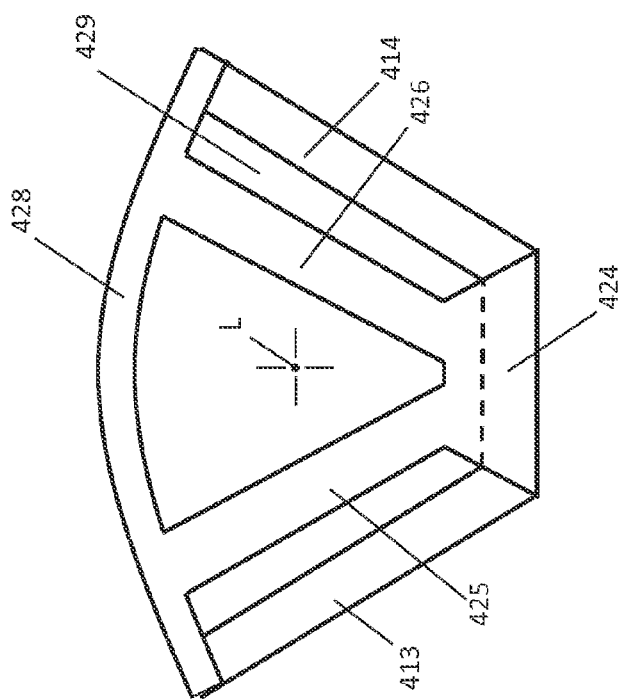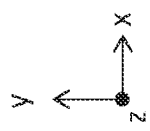
FIG. 4A

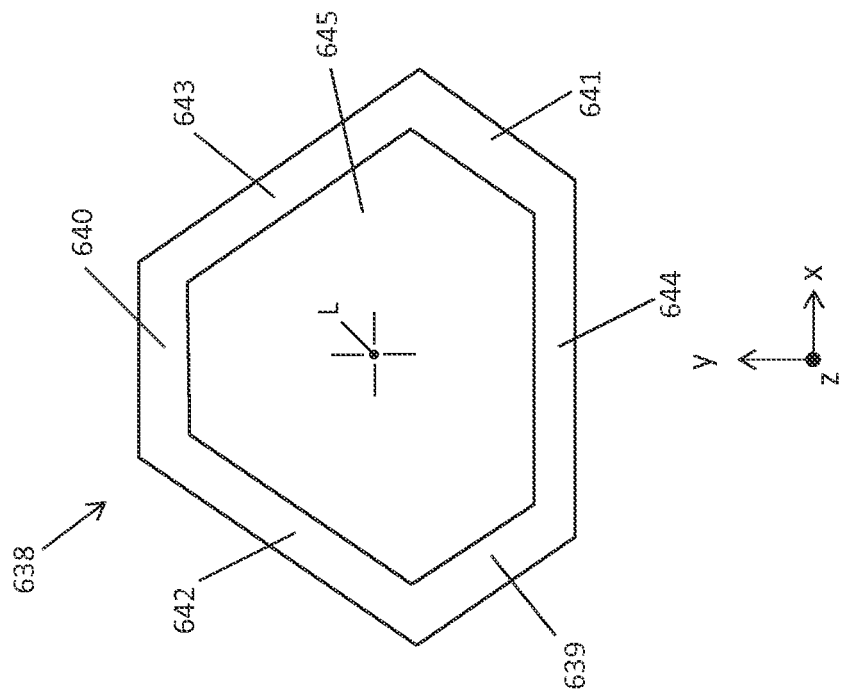
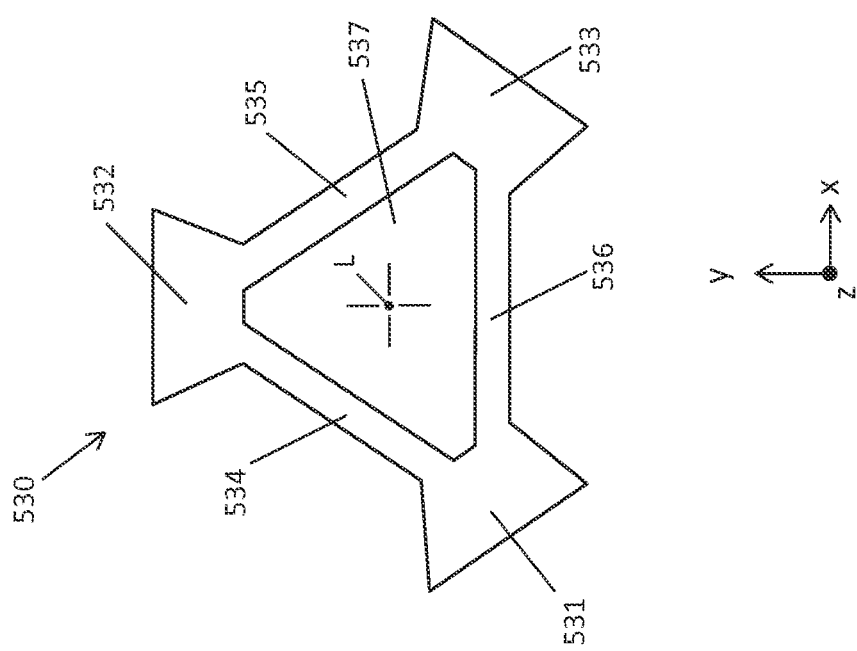

FLUID-COOLED HEAT SINK FOR USE IN COOLING VARIOUS DEVICES

RELATION TO OTHER APPLICATIONS

This application is a divisional of and claims priority from nonprovisional patent application Ser. No. 13/021,853 filed Feb. 7, 2011, which is hereby incorporated by reference.

GOVERNMENT INTERESTS

The United States Government has rights in this invention pursuant to Contract No. DE-AC36-08GO28308, between the U.S. Department of Energy (DOE) and the Alliance for Sustainable Energy.

FIELD OF THE INVENTION

One or more embodiments relates to a fluid-cooled heat sink having a heat transfer base for receiving heat generated by a heat source and having a plurality of heat transfer fins in thermal communication with the heat transfer base. The heat transfer base and the heat transfer fins form a central fluid channel through which a forced or free cooling fluid may flow, and the heat transfer pins are arranged around the central fluid channel with a flow space provided between adjacent pins, allowing for some portion of the central fluid channel flow to divert through the flow space. Flow spaces between adjacent fins are provided throughout the longitudinal length of the fluid-cooled heat sink. The fluid-cooled heat sink may be fabricated as a series of individual and discrete longitudinal sections and assembled by layering the longitudinal sections. When the plurality of longitudinal sections forms the fluid-cooled heat sink, adjacent longitudinal sections are in physical contact and thermal communication at the respective base sections, and a longitudinal axis extends through the bounded peripheries of each longitudinal section, such that the fluid sections within the bounded periphery of each longitudinal section combine to comprise the central fluid channel.

BACKGROUND

Finned and pinned heat sinks are commonly used for enhancing heat transfer in power electronics and microelectronics applications. The use of finned/pinned heat sinks reduces the thermal resistance and operating temperatures of components and assemblies by increasing the available surface area for convective heat transfer.

Typically the heat sink is a parallel or staggered array of thin flat plates or pins attached to a single, thermally conductive baseplate. The overall performance of a pin-fin heat sink depends on a number of parameters including the dimensions of the base-plate and pin-fins, pin-fin density, longitudinal and transverse spacings, the thermal conductivity of the material, approach velocities, and the geometric arrangement of pins or fins. Heat transfer from the sink occurs via free or forced convection in the channels formed between adjacent fins or pins. When forced, air flow is generally in a direction parallel to the base plate. The heat transfer rate from the heat sink is largely determined by the amount of flow through the heat sink, which is determined by the ratio of the heat resistance to the flow resistance of the surroundings. Higher flow resistances such as those which occur in staggered arrays will have less flow entering the heat sink, and may experience higher degrees of bypassing flow. Such bypassing flow is particularly relevant to the performance of pin arrays, which are often utilized in applications where the direction of the approaching flow is unknown or may change. The higher flow resistances also generally result in a higher proportion of the flow escaping through the top and sides before reaching the outflow side. These issues are mitigated when the finned or pinned heat sink is shrouded and the flow is confined, however high resistances still depress flow and thermal performance suffers.

The balance between flow and geometry in a heat sink is difficult to optimize, because increasing fin density increases the surface area for heat transfer, but also complicates the flow resistance and may depress flow to the point where overall heat transfer decreases for a given pumping power. Pumping power is generally parasitic and for forced convection applications, minimizing flow requirements based on a maximum allowable temperature in a heat sink is typically the goal. As a general statement, increasing the number of rows of pins or fins that a flow is expected to traverse can be expected to increase overall heat transfer coefficients while also increasing pressure loss through the heat sink and increasing the pumping requirement. Further, boundary layer growth among fins impacts nearest and downstream neighbors and may adversely affect the heat transfer coefficient of a given fin in the array. Typically in a multi-row fin or pin array, the highest heat transfer coefficients are found in the first row of fins. Some degree of impingement flow is typically occurring on the first row fins, breaking down boundary layer growth.

As is understood, flow through the heat sink and the resulting heat transfer coefficients is only one aspect of the overall thermal network governing heat sink performance. The thermal network of a finned heat sink is made up of conductive, radiative, and convective resistances as, from the junction of the device, heat is transported by conduction from the device through the interface and into the heat sink, where heat is usually removed mainly by means of convection via the air flow, as well as some typically negligible radiation cooling. The conductive resistance is a frequent area of concern and significant effort is aimed at reducing the material resistances of base-plates and pin-fins, contact resistances between a base-plate and a pin or fin, and fin-pin resistances. Material resistances are typically a function of geometry and material properties and are generally manipulated by those factors. Contact resistances may be impacted by many additional factors, such as surface irregularities at the interface, the geometry of the interfacing joint, adhesives utilized at the joint, and other influences. One effective method of eliminating the contact resistance is machining the pin-fins as an integral part of the base, however this can present fabrication difficulty, particularly as the size of heat sources and the heat sinks required to service them continue to decrease. Fin-pin resistances are similarly influenced by many factors, however fin-pin resistances are generally an inverse function of the fin-pin base area, so that maximizing the fin-pin base area in light of other prevailing heat sink factors is typically desired.

A variety of fabrication methodologies are employed in the production of pinned or finned heat sinks. Often the fins or pins and the base-plate are manufactured as separate elements, then fitted at an interface such as a fin slot or attached via brazing or some other method. These methods may increase contact resistances as discussed supra, and may become increasingly difficult as heat sink dimensions decrease. Alternate methods such as injection molding, etching, and laser melting are used to fabricate the fins-pins and base-plate as integral units, however fabrication ease greatly suffers. Additionally, in state-of-the-art heat sink fabrication methodologies, fabricating fins-pins and base-plates as integral units can be exceedingly difficult when the fins or pins may be required to have more complex cross-sections to enhance convective heat removal, such as elliptical, helical, or similarly shaped cross sectional profiles.

It would be advantageous to provide a heat sink addressing the various short comings of current heat sink technologies. A heat sink whereby flow geometries are designed in such a manner that flow resistance for a given fin density is minimized would act to increase the overall heat transfer capabilities of the heat sink while minimizing any parasitic pumping power required. Further, a heat sink providing a flow geometry whereby first row fins are maximized would limit boundary layer growths and increase average heat transfer coefficients across the fins. A heat sink providing a flow geometry which allows a high fin base area in contact with the base-plate would provide further advantage by decreasing fin thermal resistances. Additionally, providing a heat sink geometry where the fins can be easily fabricated as integral units with the base-plate would reduce contact resistances and improve overall performance. It would be further advantageous if the heat sink could be manufactured as a series of interleaved sections, so that the fin and base plate could be fabricated integrally in each section, and the composite heat sink having fin integral with the base-plate could be easily assembled. It would be further advantageous if such as arrangement provided for the servicing of multiple heat sources from a single and centralized fluid channel, in order to reduce the physical footprint of the heat sink in an operating application.

Accordingly, it is an object of this disclosure to provide a fluid-cooled heat sink having a flow geometry which minimizes flow resistance for a given fin density in order to minimize pumping power requirements.

Further, it is an object of this disclosure to provide a fluid-cooled heat sink having a flow geometry whereby first row fins are maximized, in order to limit boundary layer growths and increase average heat transfer coefficients across the fins.

Further, it is an object of this disclosure to provide a fluid-cooled heat sink having a flow geometry allowing a high fin base area in contact with the base-plate, in order to decrease fin thermal resistances.

Further, it is an object of this disclosure to provide a fluid-cooled heat sink whereby the fins can be easily fabricated as integral units with the base-plate, in order to reduce contact resistances and improve overall performance.

Further, it is an object of this disclosure to provide a fluid-cooled heat sink which may be manufactured as a series of interleaved sections, so that the fin and base plate can be fabricated integrally in each section, and the composite heat sink having fins integral with the base-plate can be easily assembled.

Further, it is an object of this disclosure to provide a fluid-cooled heat sink whereby the flow geometry further allows for the servicing of multiple heat sources from a single and centralized fluid channel, in order to reduce the physical footprint of the heat sink in an operating application.

These and other objects, aspects, and advantages of the present disclosure will become better understood with reference to the accompanying description and claims.

SUMMARY

The disclosure provides a fluid-cooled heat sink having a heat transfer base for receiving heat generated by a heat source and a plurality of heat transfer fins in thermal communication with the heat transfer base. The heat transfer base and the heat transfer fins form a central fluid channel through which a forced or free cooling fluid may flow, and the heat transfer fins are arranged around the central fluid channel with a flow space provided between adjacent fins, allowing for some portion of the central fluid channel flow to divert through the flow space. Flow spaces between adjacent fins are provided throughout the longitudinal length of the fluid-cooled heat sink. The central fluid channel with a periphery comprised of the heat transfer base such and a plurality of heat transfer fins allows for optimized thermal contact between the plurality of fins and the heat transfer base and greatly improves overall thermal performance. The combination of these aspects provides for the basic operation of the fluid-cooled heat sink as described while allowing for optimized thermal performance.

The fluid-cooled heat sink may be described as a series of longitudinal sections, where each longitudinal section forms a bounded periphery surrounding a longitudinal axis L and enclosing a portion of the central fluid channel. The bounded periphery is comprised of one or more base sections and one or more heat transfer fins, and may be further comprised of one or more shroud sections in order to close the bounded periphery. When the plurality of longitudinal sections forms the fluid-cooled heat sink, adjacent longitudinal sections are in physical contact and thermal communication at least at the base sections comprising each longitudinal section, and a longitudinal axis extends through the bounded peripheries of each longitudinal section, such that the fluid sections within the bounded periphery of each longitudinal section combine to comprise the central fluid channel.

The fluid-cooled heat sink of this disclosure generates significant advantages. By providing a fluid-cooled heat sink with a central fluid channel providing diverted or diverting flow through the heat transfer fins, the number of rows in the flow direction of an embodiment may be reduced a given fin density. This reduces the pressure drop of the flow through the fins below that which would be experienced if the flow was arranged in a typical side-inlet, side-exit configuration, where a single flow would encounter all rows of fins in a sequential order. Further, the arrangement of the central fluid channel relative to the flow passages between fins optimizes the overall heat transfer of the fluid-cooled heat sink, since maximum heat transfer coefficients generally arise in the first-row of fins encountered by a flow. Further, the arrangement of the central fluid channel relative to the flow passages allows the base conduction area of a heat transfer fin to provide optimized thermal contact between the heat fins and a base section, so that the base conduction area may more closely approximate the contact area between the base section and serviced heat source. Further, the flow geometry provided by the fluid-cooled heat sink of this disclosure allows a heat sink having a central fluid channel to service a plurality of heat sources, reducing the physical footprint in an operating environment.

The fluid-cooled heat sink may be fabricated as a series of individual and discrete longitudinal sections and assembled by layering the longitudinal sections. The sections may be interleaved such that thermal communication is established at the base sections of adjacent longitudinal sections, and such that a longitudinal axis extends through the bounded peripheries of all longitudinal sections. In the composite unit so fabricated, the fluid sections within the bounded periphery of each longitudinal section comprise the central fluid channel of the fluid-cooled heat sink. It can be appreciated that individual longitudinal sections as described may be fabricated with any dimensions and through a variety of means, and with a variety of materials to optimize heat sink performance under applicable operating conditions.

The novel process and principles of operation are further discussed in the following description.

BRIEF DESCRIPTION OF THE DRAWINGS

FIG. 1A illustrates an embodiment of the fluid-cooled heat sink with applicable dimensional axes.

FIG. 1B illustrates a separate view of the embodiment with bounding geometric planes with the applicable dimensional axes.

FIG. 3 illustrates a second longitudinal section of the embodiment bounded by geometric planes with the applicable dimensional axes.

FIG. 4A illustrates overlaid first and second longitudinal sections with the applicable dimensional axes.

FIG. 4B illustrates a separate view of the overlaid first and second longitudinal sections with the applicable dimensional axes.

FIG. 5 illustrates a first longitudinal section of an embodiment servicing multiple heat sources with the applicable dimensional axes.

FIG. 6 illustrates a second longitudinal section of the embodiment servicing multiple heat sources with the applicable dimensional axes.

DETAILED DESCRIPTION

Figure 2B:
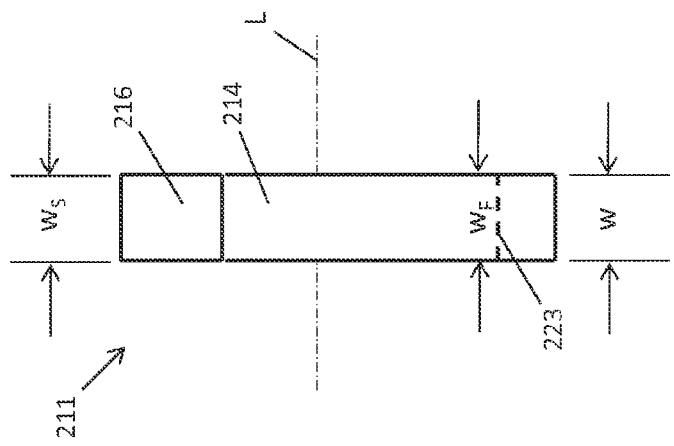
FIG. 2B illustrates a separate view of the first longitudinal section of the embodiment bounded by geometric planes with the applicable dimensional axes.

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a fluid-cooled heat sink with improved fin areas and efficiencies for use in cooling various devices.

The fluid-cooled heat sink includes a heat transfer base for receiving heat generated by a heat source and a plurality of heat transfer fins in thermal communication with the heat transfer base. The heat transfer base and the heat transfer fins form a central fluid channel through which a cooling fluid may flow. The heat transfer fins are arranged around the central fluid channel with a flow space provided between adjacent fins, allowing for some portion of the central fluid channel flow to divert through the flow space, or allowing for fluid flowing through the flow space to converge in the central fluid channel. Flow passages between adjacent fins are provided throughout the longitudinal length of the fluid-cooled heat sink. The central fluid channel with a periphery comprised of the heat transfer base such and a plurality of heat transfer fins allows for optimized thermal contact between the plurality of fins and the heat transfer base and greatly improves overall thermal performance.

A basic embodiment of the fluid-cooled heat sink is illustrated at FIGS. 1A and 1B. FIGS. 1A and 1B illustrate the same basic embodiment from differing perspectives as indicated by the coordinate axis included at each figure. At FIG. 1A, the fluid-cooled heat sink is in thermal contact with a heat source at heat transfer area 101, and experiences conduction heat through heat transfer base 102. Heat transfer base 102 is attached to and in thermal communication with heat transfer fins such as fins 103, 104, 105, and 106. As is understood, when the temperature of fins 103 through 106 is below that of heat transfer base 102, and the temperature of heat transfer base 102 is below that of the heat source, heat flow from the heat source to heat transfer base 102 and subsequently to fins 103 through 106 is expected.

Fins 103 through 106 are substantially longitudinal and each has a base conduction area at a first end. The base conduction area of each fin is in physical contact with heat transfer base 102 and provides for heat conduction between the fin and heat transfer base 102. For example, at FIG. 1A, fin 105 has base conduction area 113 in physical and thermal contact with heat transfer base 102. Base conduction area 113 has physical dimension in the x-y plane as illustrated at FIG. 1, and further has an area width dimension w in a direction parallel to the z-axis, as illustrated at FIG. 1B. The area width dimension w may vary from fin to fin among the plurality of fins, however an advantage of the fluid-cooled heat sink of this disclosure is the fin arrangement providing for maximized contact between the base conductions areas and the heat transfer base, based on the geometry of the various cooling flow passages within the fluid-cooled heat sink.

In the embodiment illustrated at FIG. 1A, the fluid-cooled heat sink is further comprised of shroud 107 extending between the plurality of fins which includes fins 103 and 104 and the plurality of fins which include fins 105 and 106. As a result, heat transfer base 102, shroud 107, and the heat transfer fins including fins 103 through 106 define a central fluid channel 108 extending through the fluid-cooled heat sink in a direction substantially parallel to the z-axis at FIGS. 1A and 1B, and having a longitudinal axis extending through the fluid-cooled heat sink in a direction parallel to the z-axis at FIGS. 1A and 1B. With reference to FIG. 1B, the central fluid channel allows a fluid flow $F_L$ to proceed through the interior of the fluid-cooled heat sink in a direction substantially parallel to the z-axis at FIG. 1B. FIG. 1B further illustrates the plurality of heat transfer fins including fins 105 and 106, shroud 107, and heat transfer base 102. As illustrated in this embodiment, heat transfer base 102 extends the length of the central fluid channel.

In operation, a fluid flow such as $F_L$ may flow through central fluid channel 108 as a cooling flow in a direction substantially parallel to the z-axis at FIG. 1A. The fluid flow $F_L$ contacts the heat transfer fins such as fins 103 through 106 facilitating convection heat transfer from fins 103 through 106. Further, and significantly, the heat transfer fins are arranged such that a flow space is provided between adjacent fins, allowing for some portion of the fluid flow to divert through the flow space. For example, fins 105 and 106, while in part defining the periphery of central fluid channel 108 as discussed, are further arranged such that flow space 109 between fins 105 and 106 is provided. As a result, some portion of fluid flow $F_L$ proceeding through central fluid channel 108 may divert from the central fluid channel 108 and proceed through flow space 109, exiting as fluid flow $F_R$ at FIG. 1A. Flow space 109 thus provides for significant additional convective heat transfer from fins 105 and 106. Similarly, fins 103 and 104 are arranged to provide flow space 110. Similar flow passages between adjacent fins are provided throughout the longitudinal length of the fluid-cooled heat sink so that over the length, flow diverts from the central fluid channel and proceeds around each heat transfer fin.

The fluid-cooled heat sink of this disclosure provides a central fluid channel with a periphery comprised of a heat transfer base such as 102 and a plurality of substantially longitudinal heat transfer fins such as 103 through 106, and further provides for a flow space between each heat transfer fin and an adjacent fin or fins, such as flow space 109 between adjacent fins 105 and 106. The combination of these aspects provides for the basic operation of the fluid-cooled heat sink as described while allowing for optimized thermal contact between the plurality of fins and the heat transfer base, through advantageous coverage by the base conduction areas at the base of each fin.

The advantageous coverage by the base conduction areas for the plurality of fins may be described by considering the fluid-cooled heat sink as a series of longitudinal sections. The central fluid channel 108 within the fluid-cooled heat sink has a longitudinal axis parallel to the z-axis at FIGS. 1A and 1B. The fluid-cooled heat sink is described as a plurality of longitudinal sections perpendicular to and extending the length of this longitudinal axis. For example, with reference to FIG. 1B, the longitudinal sections bounded between geometric planes A-A' and B-B' or B-B' and C-C', where A-A', B-B', and C-C' are x-y planes perpendicular to the z-axis as shown. The plurality of the longitudinal sections are combined to produce the fluid-cooled heat sink disclosed, where each longitudinal section has a bounded periphery enclosing some portion of the central fluid channel, and comprised of one or more base sections and one or more heart transfer fins. The heat transfer fins in adjacent longitudinal sections—for example, first longitudinal section 111 between B-B' and C-C' and second longitudinal section 123 between A-A' and B-B'—are situated such that thermal communication between the base conduction areas and the heat transfer base are maximized, while flow passage between the fins provides fluid communication between the central fluid channel and an environment surrounding the fluid-cooled heat sink.

A first longitudinal section 111 in the plurality of longitudinal sections is located between geometric planes B-B' and C-C' at FIG. 1B, as discussed. This first longitudinal section 111 is further represented at FIGS. 2A and 2B and generally indicated at 211, with directional axes corresponding to FIGS. 1A and 1B as shown. The longitudinal axis of the central fluid channel extends through first longitudinal section 211 in a direction parallel to the z-axis, as indicated by longitudinal axis L at FIGS. 2A and 2B.

First longitudinal section 211 may be described as a bounded periphery which surrounds the longitudinal axis L and encloses a portion of the central fluid channel, represented as fluid section 212. The bounded periphery of this disclosure is comprised of one or more base sections and one or more heat transfer fins. In the embodiment illustrated at FIG. 2A, the bounded periphery of first longitudinal section 211 is comprised of base section 215 and heat transfer fins 213 and 214. The bounded periphery in this disclosure may be formed entirely by alternating base sections and heat transfer fins, however in the embodiment depicted at FIGS. 2A and 2B, the bounded periphery of first longitudinal section 211 is further comprised of shroud section 216 between heat transfer fin 213 and heat transfer fin 214, in order to close the bounded periphery such that the bounded periphery surrounds the longitudinal axis L and encloses fluid section 212. Further, first longitudinal section 211 has a width w as indicated at FIG. 2B. As used here, the width w refers to the displacement between geometric planes bounding a longitudinal section, where the geometric planes are perpendicular to the longitudinal axis and where the displacement is determined in a direction parallel to the longitudinal axis. For example, at FIG. 2B, the width w is the displacement between geometric planes B-B' and C-C' at FIG. 1B, determined in a direction parallel to the z-axis shown.

As stated, the bounded periphery is comprised of one or more base sections, such as base section 215 comprising the bounded periphery of first longitudinal section 211. As illustrated, base section 215 has a base width equivalent to the width w of first longitudinal section 211. However, it is not intended that the interior or exterior surfaces of a base section be restricted to only substantially planer surfaces, as is depicted by surfaces 219 and 221 for the embodiment shown at FIG. 2A. The interior or exterior surfaces of a base section may be planer, curvilinear, curved, or take any contour provided that the base section has a base width equivalent to the width w, where the base width is the displacement between the geometric planes bounding the longitudinal section and where the displacement is determined in a direction parallel to the longitudinal axis.

Figure 2A:
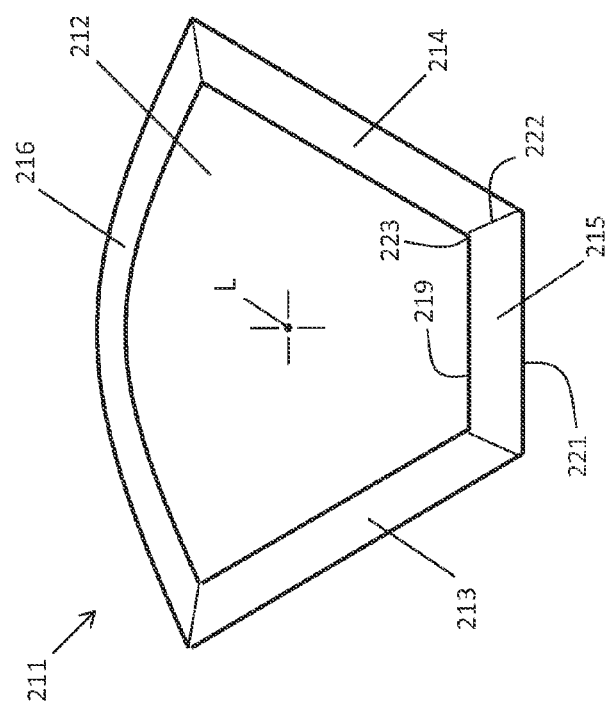
FIG. 2A illustrates a first longitudinal section of the embodiment bounded by geometric planes with the applicable dimensional axes.

The bounded periphery is further comprised of one or more heat transfer fins, such as heat transfer fins 213 and 214 comprising the bounded periphery of first longitudinal section 211. Each heat transfer fin is substantially longitudinal and is comprised of at least a first end, where the fin width at the first end is equivalent to the width w. A base conduction area is located at the first end and is bounded by the physical dimensions of the heat transfer fin at the first end, including the fin width equivalent to the width w. For example, heat transfer fin 214 is comprised of base conduction area 222 at a first end, and base conduction area 222 is bounded by the physical dimensions of heat transfer fin 214 at the first end, including dimension 223 extending over the fin width $w_F$, where $w_F$ is equivalent to the width w. Further, the base conduction area is physically attached to and in thermal communication with a base section at the first end, as illustrated at FIGS. 2A and 2B, such that the heat transfer fin and the base section form a contiguous portion of the bounded periphery. For example, heat transfer fin 214 is attached to base section 215 by base conduction area 222, and heat transfer fin 214 and base section 215 form a contiguous portion of the bounded periphery of first longitudinal section 211.

It is not necessary that the fin width of a given heat transfer fin be uniform throughout the entire length of the substantially longitudinal fin, provided that the fin width is equivalent to the width w at the first end of the heat transfer fin, so that the base conduction area of the heat transfer fin has a dimension $w_F$ equivalent to the width w where the heat transfer fin and a base section form a contiguous portion of the bounded periphery. For example, in the embodiment at FIG. 2B, heat transfer fin 214 has a fin width $w_F$ equivalent to the width w at the first end, where base conduction area 222 is located and where heat transfer fin 214 is attached to base section 215. However, the remainder of heat transfer fin 214 is not similarly constrained, and that portion of a heat transfer fin not comprising a base conduction area may have any fin width equivalent to or less than the width w. In keeping with this description, in embodiments where a longitudinal heat transfer fin is attached to a base section at the first end and further attached to a second base section at a second end, such that a second base conduction end additionally exists at the second end, the fin width at the second end is similarly equivalent to the width w.

Further, it is understood that while heat transfer fin 214 and base section 215 are joined at base conduction area 222, this is not meant to imply that heat transfer fin 214 and base section 215 must be separable elements connected through some joining methodology such as brazing. Although this may be the case, heat transfer fin 214 and base section 215 may also be integrally fashioned from a single piece of material, so that the attachment is materially continuous and contact resistances are eliminated. Further, while base conduction area 223 has a dimension $w_F$ equivalent to the width w and parallel to the z-axis as shown, the remaining dimensions of base conduction area 223 are not similarly constrained. For example, a base conduction area may have greater dimensions in the x-y plane than those shown by base conduction area 223, so that thermal contact between a heat transfer fin and a base section is increased.

In operation, the one or more base sections comprising the bounded periphery of a given longitudinal section are intended to be in thermal communication with the heat source the fluid-cooled heat sink is intended to service. For example, in operation, heat transfer surface 221 would be in thermal communication with a serviced heat source. A heat transfer fin in thermal communication with a base section subsequently receives heat flow from the base section via the base conduction area at the first end of the heat transfer fin.

The bounded periphery of first longitudinal section 211 is further comprised of shroud section 216. As discussed, the bounded periphery of a longitudinal section may be comprised of only base sections and heat transfer fins, however when necessary to provide a bounded periphery which surrounds the longitudinal axis, shroud sections may be present. When present, the shroud section has a shroud width $w_S$ equivalent to the width w, where the shroud width is the displacement between the geometric planes bounding the longitudinal section and where the displacement is determined in a direction parallel to the longitudinal axis.

The width w may vary from a first longitudinal section to a second longitudinal section among a plurality of longitudinal sections comprising the fluid-cooled heat sink of this disclosure, however providing for a fin width equivalent to the width w at the base conduction areas enhances the thermal contact between a heat transfer fin and a base section and improves the performance of the fluid-cooled heat sink in conjunction with the various cooling flow passages within the fluid-cooled heat sink.

As described, the fluid-cooled heat sink is further comprised of flow passages between heat transfer fins in adjacent longitudinal sections. The flow passages may result from variations in fin widths over the heat transfer fins in adjacent longitudinal sections, however in a preferred embodiment, the flow passages results from varying displacement of the heat transfer fins in adjacent longitudinal sections from the longitudinal axis L, as is illustrated at FIGS. 3 and 4.

FIG. 3 illustrates a second longitudinal section 323 in the plurality of longitudinal sections comprising the fluid-cooled heat sink, with directional axes corresponding to FIGS. 2A and 2B as shown. Second longitudinal section 323 is located between geometric planes A-A' and B-B' at FIG. 1B, and is an adjacent longitudinal section relative to first longitudinal section 211. Second longitudinal section 323 forms a bounded periphery surrounding the longitudinal axis L and enclosing a portion of the central fluid channel, represented as fluid section 312. The bounded periphery of second longitudinal section 323 is comprised of base section 324 and heat transfer fins 325 and 326. The heat transfer fins are substantially longitudinal and comprised of a base conduction area at a first end, such as base conduction area 327 at the first end of heat transfer fin 326. Heat transfer fin 326 is physically attached to and in thermal communication with base section 324 at base conduction area 327. Second longitudinal section 323 is further comprised of shroud section 328 between heat transfer fins 325 and 326, in order to close the bounded periphery such that the bounded periphery surrounds the longitudinal axis L and encloses fluid section 312.

FIGS. 4A and 4B illustrate the second longitudinal section of FIG. 3 and the first longitudinal section of FIGS. 2A and 2B arranged as adjacent longitudinal sections in the fluid-cooled heat sink, with directional axes corresponding to FIG. 3 as shown. In terms of FIG. 1, FIGS. 4A and 4B illustrate a section of the fluid-cooled heat sink between geometric planes A-A' and C-C'. The second longitudinal section is comprised of base section 424, heat transfer fins 425 and 426, and shroud section 428, and is overlaid on the first longitudinal section. The first longitudinal section is comprised of base section 415, heat transfer fins 413 and 414, and shroud section 416. The first longitudinal section and the second longitudinal section each form a bounded periphery surrounding the longitudinal axis L and enclosing respective fluid sections. This view is equivalent to observing the section of the fluid-cooled heat sink from geometric plane A-A' to geometric plane C-C' at FIG. 1B.

The first longitudinal section and the second longitudinal section are in physical contact and thermal communication at the respective base sections 424 and 415, as illustrated at FIG. 4B. Further, the longitudinal axis L extends through the bounded peripheries of both longitudinal sections, such that the respective fluid sections within each bounded periphery together comprise a section of the central fluid channel. With base sections 424 and 415 in physical contact and the longitudinal axis L extending through the bounded peripheries of both longitudinal sections, a flow space exists between a first heat transfer fin in the first longitudinal section and a second heat transfer fin in the second longitudinal section. For example, at FIGS. 4A and 4B, flow space 429 exists between heat transfer fin 426 in the first longitudinal section and heat transfer fin 414 in the second longitudinal section. A similar flow space exists between heat transfer fins 425 and 413. In the embodiment depicted, the fin widths are equivalent to the width w of the respective longitudinal sections over the substantially longitudinal length of the heat transfer fins, however, as discussed previously, this is not strictly required.

In the embodiment shown, flow space 429 between heat transfer fin 426 and heat transfer fin 414 arises due a differing displacement of the respective heat transfer fins from the longitudinal axis L. Displacement from the longitudinal axis L as used in this sense means the distance between the longitudinal axis L and the nearest intersection between a heat transfer fin and a geometric plane including the longitudinal axis L, where the distance is determined in a direction perpendicular to the longitudinal axis L. For example, at FIG. 4A, any geometric plane which includes the longitudinal axis L and intersects both heat transfer fin 426 and 414 generates a first displacement from the longitudinal axis L to heat transfer fin 414 and a second displacement from the longitudinal axis L to heat transfer fin 426, where the first displacement is greater than the second displacement. In the embodiment depicted, this differing displacement of the respective heat transfer fins creates flow space 429 between the respective fins.

A plurality of longitudinal sections may be arranged similar to that depicted at FIGS. 4A and 4B to generate the fluid-cooled heat sink depicted at FIGS. 1A and 1B. When the plurality of longitudinal sections forms the fluid-cooled heat sink, adjacent longitudinal sections are in physical contact and thermal communication at least at the base sections comprising each longitudinal section, and a longitudinal axis L extends through the bounded peripheries of each longitudinal section, such that the fluid sections within the bounded periphery of each longitudinal section combine to comprise the central fluid channel having the longitudinal axis L. Further, with the base sections of adjacent longitudinal sections in physical contact and the longitudinal axis L extending through the bounded peripheries of each longitudinal section, a flow space exists between a first heat transfer fin in a first longitudinal section and a second heat transfer fin in a second longitudinal section, where the first longitudinal section and the second longitudinal section are adjacent.

The fluid-cooled heat sink of this disclosure generates significant advantages. As is understood, the heat removal capacity of a finned heat sink is directly related to the amount of flow through the heat sink, which is dependent on the pressure drop experienced by the flow across the finned heat sink. Generally speaking, the pressure drop across heat sinks is proportional to the number of rows in the flow direction. By providing a fluid-cooled heat sink with a central fluid channel providing diverted flow through the heat transfer fins, the number of rows in the flow direction in an embodiment such as that depicted at FIGS. 1A and 1B may be halved for a given fin density. This reduces the pressure drop of the flow through the fins below that which would be experienced if the flow was arranged in a typical side-inlet, side-exit configuration, where a single flow would encounter all rows of fins in a sequential order. As a result, any parasitic losses incurred by generating a forced convection flow through the central fluid channel are mitigated for a given fin density of the fluid-cooled heat sink. Further, the arrangement of the central fluid channel relative to the flow passages between fins optimizes the overall heat transfer of the fluid-cooled heat sink, since maximum heat transfer coefficients generally arise in the first-row of fins encountered by a flow. Further, the arrangement of the central fluid channel relative to the flow passages allows for mitigation of thermal spreading resistances between a base section and the heat transfer fins. The base conduction area of a heat transfer fin may be designed to provide optimized thermal contact between the heat fins and a base section comprising a bounded periphery, so that the base conduction area may more closely approximate the contact area between the base section and serviced heat source. Such optimization reduces thermal spreading resistances between heat transfer fins and base sections, and improves the performance of the fluid-cooled heat sink.

In another embodiment, the fluid-cooled heat sink is comprised of a plurality of base sections and serves a plurality of heat sources. A first longitudinal section comprising this embodiment is illustrated at FIG. 5 and generally indicated at 530, with directional axes as shown. First longitudinal section 530 is comprised of base sections 531, 532, and 533, and heat transfer fins 534, 535, and 536, forming a bounded periphery. The bounded periphery surrounds a longitudinal axis L and encloses a portion of a central fluid channel, represented as fluid section 537. As depicted at FIG. 5, in this embodiment the bounded periphery is comprised entirely of base sections and heat transfer fins, and does not contain a shroud section. The heat transfer fins 534, 535, and 536 are each substantially longitudinal with a first end comprised of a base conduction area, and are physically attached to and in thermal communication with a base section at the respective base conduction areas. Further, the heat transfer fins 534, 535, and 536 each have a second base conduction area at a second end, and are physically attached to and in thermal communication with a second base section at the respective second base conduction areas. A second longitudinal section comprising this embodiment is illustrated at FIG. 6 and is generally indicated at 638, with directional axes corresponding to FIG. 5 as shown. Second longitudinal section 638 is comprised of base sections 639, 640, and 641, and heat transfer fins 642, 643, and 644, forming a second bounded periphery. The second bounded periphery surrounds a longitudinal axis L and encloses a portion of a central fluid channel, represented as fluid section 645.

Figure 7B:
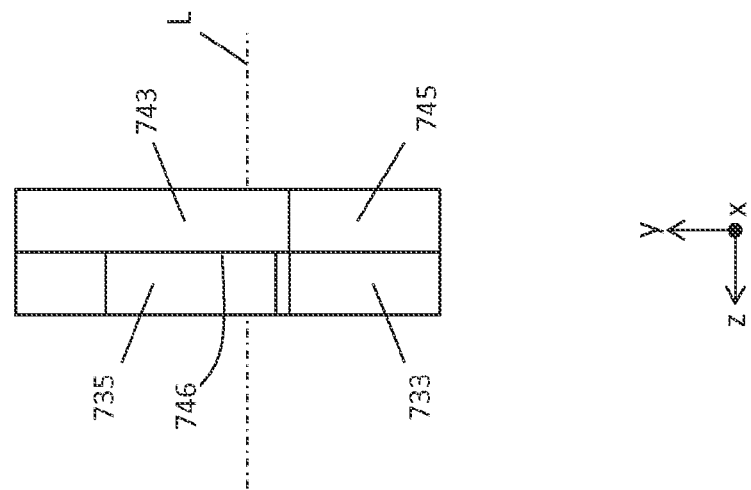
FIG. 7B illustrates a separate view of the overlaid first and second longitudinal sections of the embodiment servicing multiple heat sources with the applicable dimensional axes.
Figure 7A:
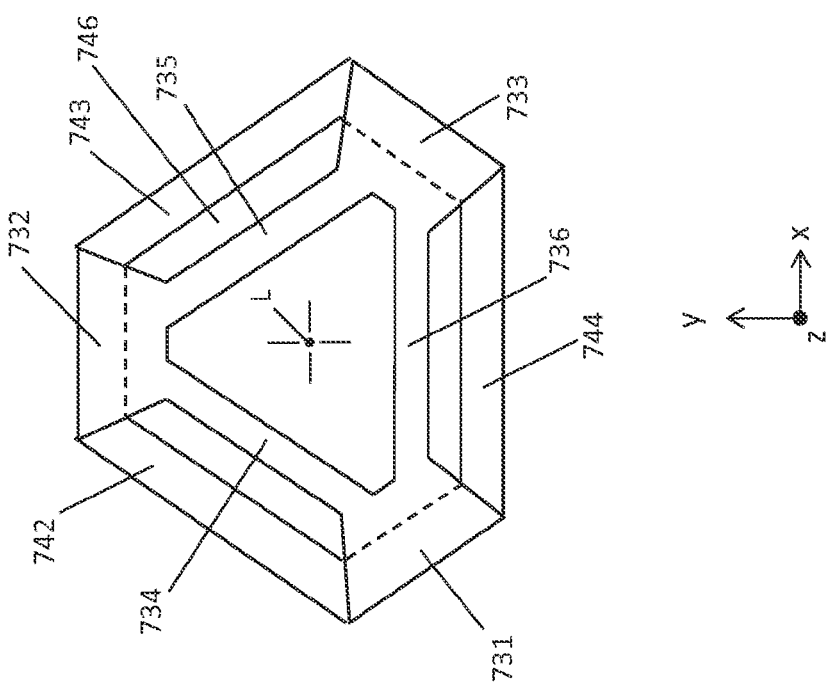
FIG. 7A illustrates overlaid first and second longitudinal sections of the embodiment servicing multiple heat sources with the applicable dimensional axes.

FIGS. 7A and 7B illustrates the first second longitudinal section of FIG. 5 and the second longitudinal section of FIG. 6 arranged as adjacent longitudinal sections in the fluid-cooled heat sink, with directional axes corresponding to FIG. 6 as shown. The first longitudinal section is comprised of base sections 731, 732, and 733, and heat transfer fins 734, 735, and 736, and is overlaid on the second longitudinal section. The second longitudinal section is comprised of heat transfer fins 732, 733, and 734, and base section 745, with the remaining base sections of the second longitudinal section hidden from view. The first longitudinal section and the second longitudinal section each form a bounded periphery surrounding the longitudinal axis L and enclosing respective fluid sections. The first longitudinal section and the second longitudinal section are in physical contact and thermal communication at respective base sections, for example base section 733 of the first longitudinal section and base section 745 of the second longitudinal section. Further, the longitudinal axis L extends through the bounded peripheries of both longitudinal sections, such that the respective fluid sections within each bounded periphery together comprise a section of the central fluid channel. With at least base sections 733 and 745 in physical contact and the longitudinal axis L extending through the bounded peripheries of both longitudinal sections, a flow space exists between a first heat transfer fin in the first longitudinal section and a second heat transfer fin in the second longitudinal section. For example, at FIGS. 7A and 7B, flow space 746 exists between heat transfer fin 735 in the first longitudinal section and heat transfer fin 743 in the second longitudinal section. A similar flow space exists between heat transfer fins 744 and 736, and between heat transfer fins 742 and 734. A plurality of longitudinal sections similar to the first longitudinal section and the second longitudinal section of FIGS. 7A and 7B may be arranged similarly to generate the fluid-cooled heat sink. When the plurality of longitudinal sections forms the fluid-cooled heat sink, adjacent longitudinal sections are in physical contact and thermal communication at at least one base section comprising each longitudinal section, and the longitudinal axis L extends through the bounded peripheries of each longitudinal section, such that the fluid sections within the bounded periphery of each longitudinal section combine to comprise the central fluid channel having the longitudinal axis L.

An advantage of the embodiment shown at FIGS. 7A and 7B is the ability to provide thermal contact between the fluid-cooled heat sink and a plurality of heat sources. For example, the fluid-cooled heat sink may be in thermal communication with the phase-generating or delivery system for a three-phase power system, where base sections 733 and 745 are in thermal communication with the generating or delivery system of a single phase, while the remaining base sections are in thermal communication with the generating or delivery systems of the remaining phases. Other applications which present a plurality of heat sources to be serviced by the heat sink can be appreciated by those skilled in the art. As is understood, the disclosure herein is not intended to be limited by a specific application.

An advantage of the fluid-cooled heat sink described herein is the ease afforded by fabricating the fluid-cooled heat as a series of individual and discrete longitudinal sections, and assembling the fluid-cooled heat sink by layering the longitudinal sections as described herein. For example, a first plurality of first longitudinal sections such as that illustrated at FIGS. 2A and 2B may be individually fabricated as discrete longitudinal sections, and a second plurality of second individual longitudinal sections such as that illustrated at FIG. 3 may be individually fabricated as discrete individual sections. Subsequently, the fluid-cooled heat sink of FIGS. 1A and 1B may be assembled by interleaving the first and second longitudinal sections in alternating fashion such that thermal communication is established at the base sections of adjacent longitudinal sections, and such that the longitudinal axis L extends through the bounded peripheries of all longitudinal sections. In the composite unit so fabricated, the fluid sections within the bounded periphery of each longitudinal section comprise the central fluid channel of the fluid-cooled heat sink. It can be appreciated that individual longitudinal sections as described may be fabricated with any dimensions and through a variety of means, and with a variety of materials to optimize heat sink performance under applicable operating conditions. Further, it is understood that when the fluid-cooled heat sink is fabricated as a series of individual and discrete longitudinal sections, where this disclosure references dimensional parameters such "the width w" and specifies a constant value of the dimensional parameter over some portion of a longitudinal section, this is intended to indicate a constant value within prevailing manufacturing tolerances.

It can further be appreciated that the fluid utilized in the central fluid channel of the fluid-cooled heat sink may be gaseous or liquid, and may be motivated either through free convection or forced convection means, depending on a desired optimization of heat sink performance under applicable operating conditions.

Thus, the disclosure provides a fluid-cooled heat sink having a heat transfer base for receiving heat generated by a heat source and a plurality of heat transfer fins in thermal communication with the heat transfer base. The heat transfer base and the heat transfer fins may be integral units in order to reduce contact resistances. The heat transfer base and the heat transfer fins form a central fluid channel through which a forced or free cooling fluid may flow, and the heat transfer fins are arranged around the central fluid channel with a flow space provided between adjacent fins, allowing for some portion of the central fluid channel flow to divert through the flow space. Flow spaces between adjacent fins are provided throughout the longitudinal length of the fluid-cooled heat sink. The fluid-cooled heat sink may be fabricated as a series of individual and discrete longitudinal sections, and assembled by layering the longitudinal sections as described herein.

Accordingly, the disclosure provides a fluid-cooled heat sink having a flow geometry which minimizes flow resistance for a given fin density in order to minimize pumping power requirements.

Further, the disclosure provides a fluid-cooled heat sink having a flow geometry whereby first row fins are maximized, in order to limit boundary layer growths and increase average heat transfer coefficients across the fins.

Further, the disclosure provides a fluid-cooled heat sink having a flow geometry allowing a high fin base area in contact with the base-plate, in order to decrease fin thermal resistances.

Further, the disclosure provides a fluid-cooled heat sink whereby the fin can be easily fabricated as integral units with the base-plate, in order to reduce contact resistances and improve overall performance.

Further, the disclosure provides a fluid-cooled heat sink which may be manufactured as a series of interleaved sections, so that the fins and base plate can be fabricated integrally in each section, and the composite heat sink having fins integral with the base-plate can be easily assembled.

Further, the disclosure provides a fluid-cooled heat sink whereby the flow geometry further allows for the servicing of multiple heat sources from a single and centralized fluid channel, in order to reduce the physical footprint of the heat sink in an operating application.

It is to be understood that the above-described arrangements are only illustrative of the application of the principles of the present invention and it is not intended to be exhaustive or limit the invention to the precise form disclosed. Numerous modifications and alternative arrangements may be devised by those skilled in the art in light of the above teachings without departing from the spirit and scope of the present invention. It is intended that the scope of the invention be defined by the claims appended hereto.

In addition, the previously described versions of the present invention have many advantages, including but not limited to those described above. However, the invention does not require that all advantages and aspects be incorporated into every embodiment of the present invention.

All publications and patent documents cited in this application are incorporated by reference in their entirety for all purposes to the same extent as if each individual publication or patent document were so individually denoted.

What is claimed is:

1. A fluid-cooled heat sink comprised of a central fluid channel having a longitudinal axis, where the fluid-cooled heat sink is comprised of:
   a plurality of longitudinal sections perpendicular to and extending the length of the longitudinal axis, where each longitudinal section has a width w, where the width w is a displacement between a first geometric plane and a second geometric plane bounding the each longitudinal section, where the first geometric plane and the second geometric plane are perpendicular to the longitudinal axis, and where the displacement is determined in a direction parallel to the longitudinal axis, and where each longitudinal section is comprised of a bounded periphery which surrounds the longitudinal axis and encloses a portion of the central fluid channel, where the bounded periphery in the each longitudinal section is comprised of,
   a base section, where the base section has a base width parallel to the longitudinal axis, where the base width is equivalent to the width w,
   a shroud section, where the shroud section has a shroud width parallel to the longitudinal axis, where the shroud width is equivalent to the width w,
   a first heat transfer fin, where the first heat transfer fin is substantially longitudinal and comprised of a first end of the first heat transfer fin and a second end of the first heat transfer fin, where the first end of the first heat transfer fin has a corresponding width parallel to the longitudinal axis, and where the first end of the first heat transfer fin has a first fin base conduction area where the corresponding width comprises a boundary of the first fin base conduction area, and where the second end of the first heat transfer fin has a reciprocal width parallel to the longitudinal axis, and where the second end of the first heat transfer fin has a first fin shroud conduction area where the reciprocal width comprises a boundary of the first fin shroud conduction area, where the first fin base conduction area is attached to the base section and the first fin shroud conduction area is attached to the shroud section, a second heat transfer fin, where the second heat transfer fin is substantially longitudinal and comprised of a first end of the second heat transfer fin and a second end of the second heat transfer fin, where the first end of the second heat transfer fin has a correlative width parallel to the longitudinal axis, and where the first end of the second heat transfer fin has a second fin base conduction area where the correlative width comprises a boundary of the second fin base conduction area, and where the second end of the second heat transfer fin has a synonymous width parallel to the longitudinal axis, and where the second end of the second heat transfer fin has a second fin shroud conduction area where the synonymous width comprises a boundary of the second fin shroud conduction area, where the second fin base conduction area is attached to the base section and the second fin shroud conduction area is attached to the shroud section, and where the second fin base conduction area is attached to the base section and the second fin shroud conduction area is attached to the shroud section such that a first line extending from the first end of the first heat transfer fin to the second end of the first heat transfer fin does not intersect a second line extending from the first end of the second heat transfer fin to the second end of the second heat transfer fin, where the first line and the second line are co-planer; and a plurality of flow spaces, where each flow space provides a flow path either between a first heat transfer fin in a primary longitudinal section and a first heat transfer fin in a secondary longitudinal section or between a second heat transfer fin in the primary longitudinal section and a second heat transfer fin in the secondary longitudinal section, where the primary longitudinal section is comprised of a primary bounded periphery surrounding a first portion of the central fluid channel and comprising a primary base section, a primary shroud section, the first heat transfer fin in the primary longitudinal section, and the second heat transfer fin in the primary longitudinal section, and where the secondary longitudinal section is comprised of a secondary bounded periphery surrounding a second portion of the central fluid channel and comprised of a secondary base section, a secondary shroud section, the first heat transfer fin in the secondary longitudinal section, and the second heat transfer fin in a secondary longitudinal section, and where the primary base section is in physical contact with the secondary base section and the primary shroud section is in physical contact with the secondary shroud section, and where the longitudinal axis extends through both the primary bounded periphery and the secondary bounded periphery, such that the first portion of the central fluid channel and the second portion of the central fluid channel form a contiguous portion of the central fluid channel.

2. The fluid-cooled heat sink of claim 1 where the first heat transfer fin in the primary longitudinal section has a primary first fin displacement from the longitudinal axis and the first heat transfer fin in the secondary longitudinal section has a secondary first fin displacement from the longitudinal axis, where the primary first fin displacement is not equal to the secondary first fin displacement, and where the second heat transfer fin in the primary longitudinal section has a primary second fin displacement from the longitudinal axis and the second heat transfer fin in the secondary longitudinal section has a secondary second fin displacement from the longitudinal axis, where the primary second fin displacement is not equal to the secondary second fin displacement, such that the each flow space in the plurality of flow spaces provides fluid communication between the central fluid channel comprising the fluid-cooled heat sink and an environment surrounding the fluid-cooled heat sink.

3. The fluid-cooled heat sink of claim 1 where the primary base section and the secondary base section are in physical contact at a geometric plane between the first longitudinal section and the second longitudinal section, where the geometric plane is perpendicular to the longitudinal axis, and where the primary base section and the secondary base section form a first boundary to the contiguous portion of the central fluid channel and additionally form a contiguous heat transfer area, where the contiguous heat transfer area is in fluid communication with the environment surrounding the fluid-cooled heat sink.

4. The fluid-cooled heat sink of claim 1 where the primary shroud section and the secondary shroud section are in physical contact at the geometric plane between the first longitudinal section and the second longitudinal section, and where the primary shroud section and the secondary shroud section form a second boundary to the contiguous portion of the central fluid channel.

5. The fluid-cooled heat sink of claim 1 where the central fluid channel has a flow inlet area at a first end of the longitudinal axis, where the flow inlet area is in fluid communication with the central fluid channel, such that an inlet flow entering the flow inlet area supplies a channel flow within the central fluid channel, and such that some portion of the channel flow flows through the each flow space.

6. The fluid-cooled heat sink of claim 1 where the first longitudinal section and the second longitudinal section are physically discrete and separable units, and where the fluid-cooled heat sink is comprised of a series of interleaved first longitudinal sections and second longitudinal sections.

7. A fluid-cooled heat sink comprised of a central fluid channel having a longitudinal axis, where the fluid-cooled heat sink is comprised of:

a plurality of longitudinal sections perpendicular to and extending the length of the longitudinal axis, where each longitudinal section has a width w, where the width w is a displacement between a first geometric plane and a second geometric plane bounding the each longitudinal section, where the first geometric plane and the second geometric plane are perpendicular to the longitudinal axis, and where the displacement is determined in a direction parallel to the longitudinal axis, and where each longitudinal section is comprised of a bounded periphery which surrounds the longitudinal axis and encloses a portion of the central fluid channel, where the bounded periphery in the each longitudinal section is comprised of,
 a base section, where the base section has a base width parallel to the longitudinal axis, where the base width is equivalent to the width w,
 a shroud section, where the shroud section has a shroud width parallel to the longitudinal axis, where the shroud width is equivalent to the width w,
 a first heat transfer fin, where the first heat transfer fin is substantially longitudinal and comprised of a first end of the first heat transfer fin and a second end of the first heat transfer fin, where the first end of the first heat transfer fin has a corresponding width parallel to the longitudinal axis, and where the first end of the first heat transfer fin has a first fin base conduction area where the corresponding width comprises a boundary of the first fin base conduction area, and where the second end of the first heat transfer fin has a reciprocal width parallel to the longitudinal axis, and where the second end of the first heat transfer fin has a first fin shroud conduction area where the reciprocal width comprises a boundary of the first fin shroud conduction area, where the first fin base conduction area is attached to the base section and the first fin shroud conduction area is attached to the shroud section,
 a second heat transfer fin, where the second heat transfer fin is substantially longitudinal and comprised of a first end of the second heat transfer fin and a second end of the second heat transfer fin, where the first end of the second heat transfer fin has a correlative width parallel to the longitudinal axis, and where the first end of the second heat transfer fin has a second fin base conduction area where the correlative width comprises a boundary of the second fin base conduction area, and where the second end of the second heat transfer fin has a synonymous width parallel to the longitudinal axis, where the second end of the second heat transfer fin has a second fin shroud conduction area where the synonymous width comprises a boundary of the second fin shroud conduction area, and where the second fin base conduction area is attached to the base section and the second fin shroud conduction area is attached to the shroud section, and where the second fin base conduction area is attached to the base section and the second fin shroud conduction area is attached to the shroud section such that a first line extending from the first end of the first heat transfer fin to the second end of the first heat transfer fin does not intersect a second line extending from the first end of the second heat transfer fin to the second end of the second heat transfer fin, where the first line and the second line are co-planer; and
 a plurality of flow spaces, where each flow space provides a flow path either between a first heat transfer fin in a primary longitudinal section and a first heat transfer fin in a secondary longitudinal section or between a second heat transfer fin in the primary longitudinal section and a second heat transfer fin in the secondary longitudinal section, where the primary longitudinal section is comprised of a primary bounded periphery surrounding a first portion of the central fluid channel and comprising a primary base section, a primary shroud section, the first heat transfer fin in the primary longitudinal section, and the second heat transfer fin in the primary longitudinal section, and where the second longitudinal section is comprised of a second bounded periphery surrounding a second portion of the central fluid channel and comprised of a second base section, a second shroud section, the first heat transfer fin in the secondary longitudinal section, and the second heat transfer fin in a secondary longitudinal section, and where the longitudinal axis extends through both the primary bounded periphery and the secondary bounded periphery, such that the first portion of the central fluid channel and the second portion of the central fluid channel form a contiguous portion of the central fluid channel, and where the primary base section and the secondary base section are in physical contact at a geometric plane between the first longitudinal section and the second longitudinal section, where the geometric plane is perpendicular to the longitudinal axis, and where the primary base section and the secondary base section form a first boundary to the contiguous portion of the central fluid channel, and where the primary shroud section and the secondary shroud section are in physical contact at the geometric plane between the first longitudinal section and the second longitudinal section, and where the primary shroud section and the secondary shroud section form a second boundary to the contiguous portion of the central fluid channel.

8. The fluid-cooled heat sink of claim 7 where the first heat transfer fin in the primary longitudinal section has a primary first fin displacement from the longitudinal axis and the first heat transfer fin in the secondary longitudinal section has a secondary first fin displacement from the longitudinal axis, where the primary first fin displacement is not equal to the secondary first fin displacement, and where the second heat transfer fin in the primary longitudinal section has a primary second fin displacement from the longitudinal axis and the second heat transfer fin in the secondary longitudinal section has a secondary second fin displacement from the longitudinal axis, where the primary second fin displacement is not equal to the secondary second fin displacement, such that the each flow space in the plurality of flow spaces provides fluid communication between the central fluid channel comprising the fluid-cooled heat sink and an environment surrounding the fluid-cooled heat sink.

9. The fluid-cooled heat sink of claim 8 where the primary base section and the secondary base section form a contiguous heat transfer area, where the contiguous heat transfer area is in fluid communication with the environment surrounding the fluid-cooled heat sink.

10. The fluid-cooled heat sink of claim 9 where the first longitudinal section and the second longitudinal section are physically discrete and separable units, and where the fluid-cooled heat sink is comprised of a series of interleaved first longitudinal sections and second longitudinal sections.

11. The fluid-cooled heat sink of claim 10 where the central fluid channel has a flow inlet area at a first end of the longitudinal axis, where the flow inlet area is in fluid communication with the central fluid channel, such that an inlet flow entering the flow inlet area supplies a channel flow within the central fluid channel, and such that some portion of the channel flow flows through the each flow space.

* * * * *